United States Patent [19]
Lee et al.

[11] 4,045,105
[45] * Aug. 30, 1977

[54] INTERCONNECTED LEADLESS PACKAGE RECEPTACLE

[75] Inventors: James C. K. Lee; Charles Joseph Donaher, both of Los Altos Hills, Calif.

[73] Assignee: Advanced Memory Systems, Inc., Sunnyvale, Calif.

[ * ] Notice: The portion of the term of this patent subsequent to Apr. 20, 1993, has been disclaimed.

[21] Appl. No.: 559,215

[22] Filed: Mar. 17, 1975

Related U.S. Application Data

[63] Continuation-in-part of Ser. No. 508,464, Sept. 23, 1974, Pat. No. 3,951,495.

[51] Int. Cl.² .......................... H05K 1/12; H05K 7/08
[52] U.S. Cl. ................................................ 339/17 CF
[58] Field of Search ............ 339/17 C, 17 CF, 47–49, 339/174, 176 MP; 317/101 CM, 101 D

[56] References Cited

U.S. PATENT DOCUMENTS

| | | | |
|---|---|---|---|
| 3,212,047 | 10/1965 | McDonough | 317/101 B X |
| 3,656,183 | 4/1972 | Walterscheid | 339/176 MP X |
| 3,696,323 | 10/1972 | Kinkaid et al. | 339/17 C X |
| 3,700,788 | 10/1972 | Spurck | 339/17 CF X |
| 3,754,203 | 8/1973 | Pauza et al. | 339/174 X |
| 3,910,664 | 10/1975 | Pauza et al. | 339/17 CF |
| 3,951,495 | 4/1976 | Donaher et al. | 339/17 CF |

Primary Examiner—Roy Lake
Assistant Examiner—Neil Abrams
Attorney, Agent, or Firm—Stuart Lubitz

[57] ABSTRACT

A leadless package receptacle for mounting and interconnecting to electronic devices (e.g. leadless package) which can be interconnected with a second receptacle for packaging such devices, said receptacles having improved spring contact members. The receptacle incorporates a plurality of uniquely designed spring contacts for connection to a printed circuit board or other circuit member in a conventional manner. The spring contacts are arranged and configured within the receptacle to yieldably engage the lower surface of the leadless package so as to maintain a line contact. In addition, each spring member has a separate arm member to engage the spring contact members of the second package. The leadless package includes a chip carrier which has a plurality of conductive areas on the lower surface thereof for engaging the spring contacts. Edge regions are cooperatively disposed on the carrier with respect to locking members on the receptacle for retaining the package in the receptacle. The receptacle also has alignment and interlocking means for accepting the second receptacle with the spring contact members of the second receptacle engaging the spring contact members of the first receptacle.

18 Claims, 6 Drawing Figures

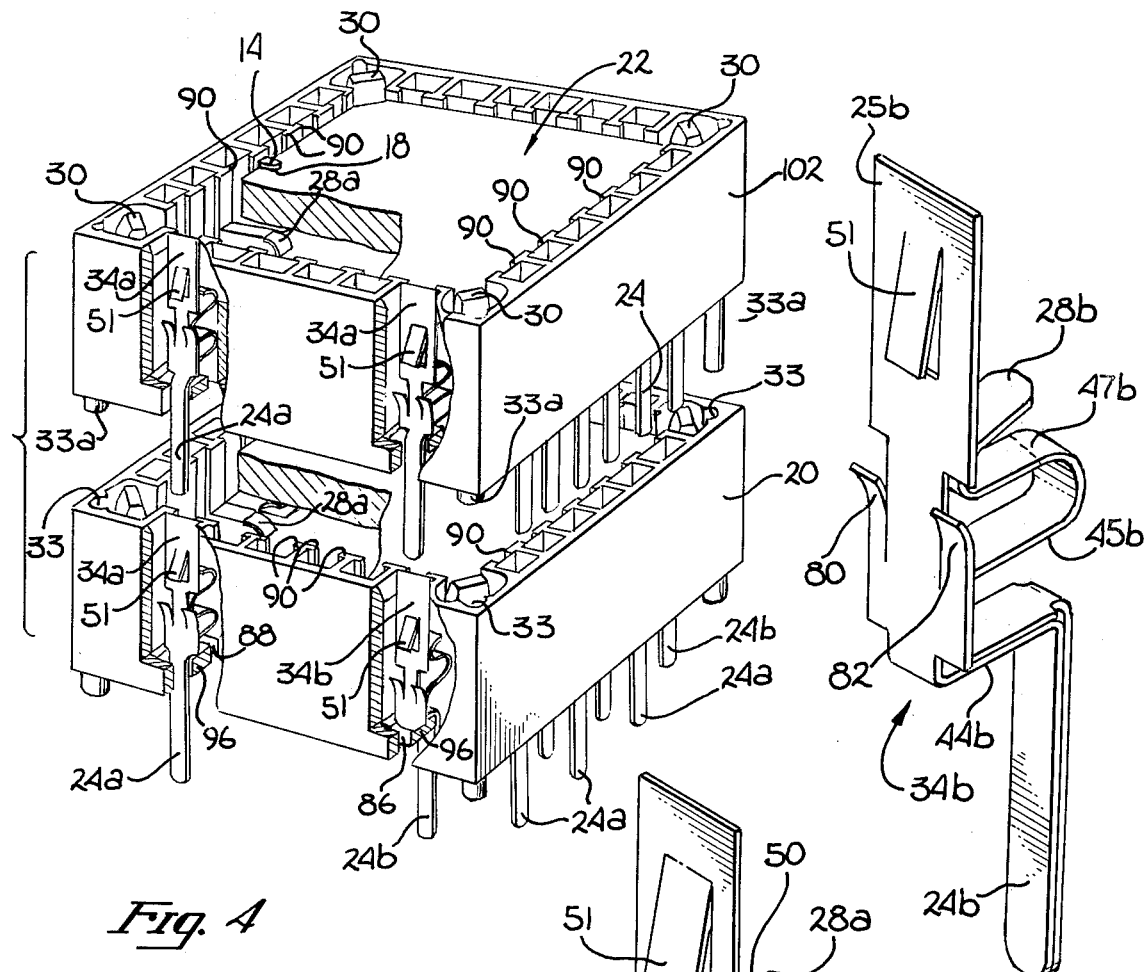
Fig. 4
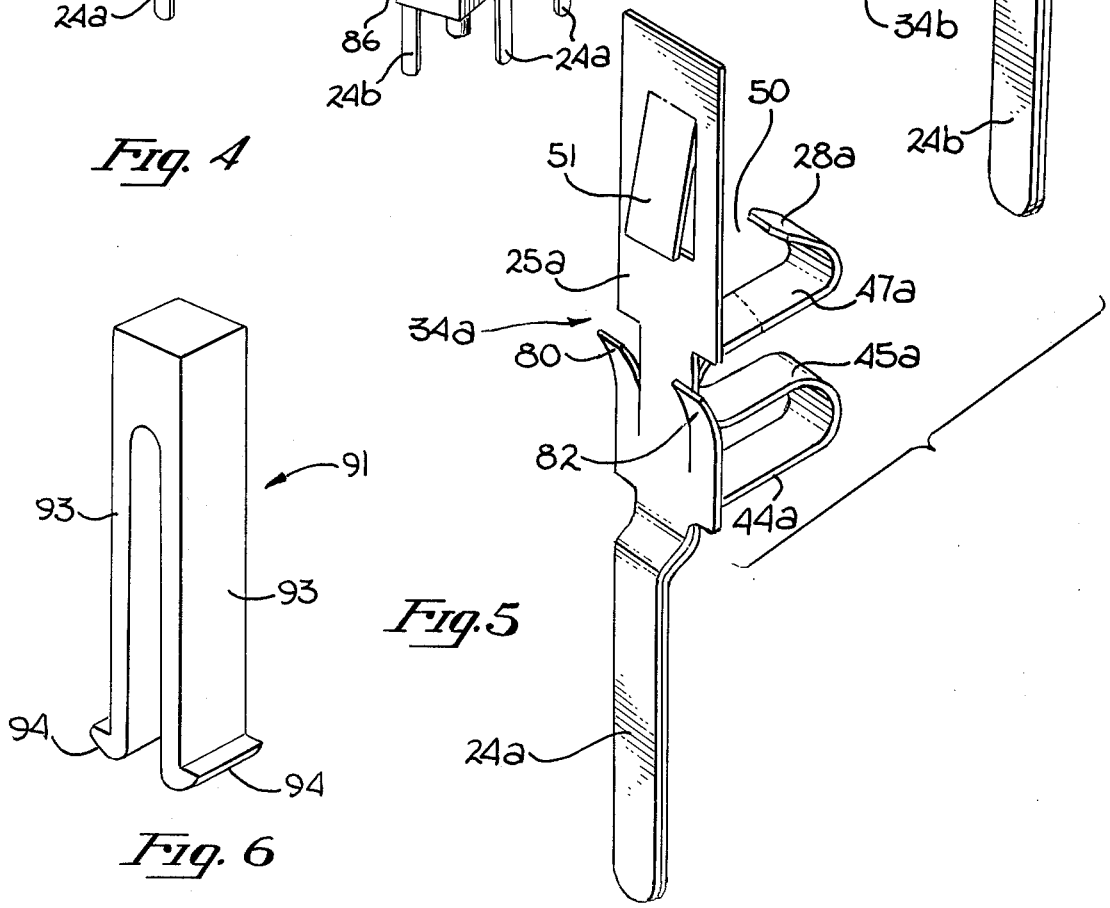
Fig. 6
Fig. 5

INTERCONNECTED LEADLESS PACKAGE RECEPTACLE

BACKGROUND OF THE INVENTION

This invention is a continuation-in-part of my earlier filed copending application, Ser. No. 508,464, filed Sept. 23, 1974 now U.S. Pat. No. 3,951,495.

FIELD OF THE INVENTION

The present invention relates to the field of electrical device interconnection, and more particularly, to the packaging and mounting of electronic devices such as integrated circuits and the interconnecting of such mounted devices.

PRIOR ART

There are many forms of packaging integrated circuits and similar devices which are well known in the prior art. The fundamental requirements for such packages include mechanical and environmental protection for the electronic device and ease of incorporating the device into a circuit, such as one formed on a printed circuit board. Other requirements may include shielding of the device from stray electric and magnetic fields and effective dissipation of the heat generated by the devices.

In recent years, integrated circuit complexity has greatly increased, and wherever possible package sizes have tended to decrease. With certain integrated circuits, particularly integrated circuits including field effect devices (e.g. MOS devices), the power dissipation is extremely low, so that package sizes and packaging densities are limited in substantial part by one's ability to produce such packages and to then utilize such packages in practical assemblies (cooling remains a consideration when such packages are employed in very high density systems). From a user's standpoint, one practical consideration is that the integrated circuit should be removable and replaceable from a printed circuit board without requiring soldering operations. Another practical consideration is that the package should occupy a minimum of circuit board area consistent with present capabilities in terms of printed circuit board conductor size and lead requirements. Similarly, the height of the package should be held to a minimum to allow the close packing of adjacent circuit boards while still providing the air flow space therebetween.

One prior package which has been used to package integrated circuits, referred to as a leadless package, utilizes a chip carrier, typically ceramic, having a pocket therein for receiving the integrated circuit and having a plurality of conductive regions extending into the cavity for connection to the chip by wire bonding. The conductive regions also extend outward to the edges of the chip carrier, each connecting to one of a plurality of conductive regions extending down the side of the chip carrier exposed so as to be electrically contactable from the side of the chip carrier. A cover seals the cavity on the chip carrier to provide mechanical and environmental protection for the electronic device (e.g. integrated circuit chip).

For mounting an assembled chip carrier to a printed circuit, a molded plastic connector having a plurality of individual leads is first soldered to the circuit board. The individual leads extend upward into the sides of a cavity in the top face of the connector so as to form spring contacts for contacting the conductive regions at each side of the chip carrier. Thus the chip carrier can be placed into and taken out of the mating connector to allow individual circuit testing or replacement, with the chip carrier being held into the connector by a separate locking member extending over the chip carrier and being retained at each end of the connector.

This type of package has a number of advantages over other packages such as the dual in-line packages, since it allows the removal of the circuit without soldering operations, is reasonably small and has reasonably good contact reliability because of the wiping action of the contacts when a chip carrier is inserted. However, the overall height of the connector is greater than may be necessary, as the chip carrier is inserted below the top surface thereof, and a separate locking element extends thereabove, serving no purpose other than to retain the chip carrier in position. Also, the spring contacts on the connector are limited in the contact pressure they may exert, as the chip carrier must be inserted and removed against the forces of the spring created by the contacts. This presents a limitation, particularly for removal purposes, as some means must be provided to release the contact pressure or force the chip carrier out of the connector in opposition to the spring forces. Further, there is a long wiping action between the spring contacts and the chip carrier otherwise necessary for proper contact.

The present invention is a further improvement of the invention disclosed in my copending application Ser. No. 508,464 now U.S. Pat. No. 3,951,495 which taught one means to overcome the aforementioned shortcomings of the prior art. In the present invention, a uniquely designed spring contact member is disposed in the receptacles which permits the receptacles to be stacked one on top of the other. Such an arrangement provides for about twice the memory density of my prior receptacle.

BRIEF SUMMARY OF THE INVENTION

A leadless package receptacle which can be coupled to a second receptacle for packaging and mounting electronic devices is described. The receptacle contains a plurality of uniquely designed spring contact members for connecting to a printed circuit board or other circuit member in a conventional manner. The spring contact members are disposed within the receptacle to yieldably engage the lower surface of the chip carrier. Each spring contact member also has a substantially vertical arm member to engage spring contact members of the second receptacle. The chip carrier package has a plurality of conductive areas on the lower surface thereof for engaging the spring contact members and further has edge regions cooperatively disposed with respect to locking members on the receptacle for retaining the package in the receptacle. The receptacles also have alignment and interlocking means which facilitate the stacking of the receptacles and the engagement of the spring members. The interlocked receptacles are of substantially the same configuration and when two such receptacles are coupled together in an upper and lower arrangement, the board density is at least doubled. The receptacle of the preferred embodiment is a molded plastic receptacle with integral aligning members and a plurality of pockets or slots for receiving and retaining the spring contacts.

BRIEF DESCRIPTION OF THE DRAWINGS

FIG. 4 is an exploded cut away view showing the upper and lower receptacles and how the spring contacts interlock.

FIG. 5 is a perspective view of one form of spring contacts disposed in the upper and lower receptacles shown in FIG. 4.

FIG. 6 is a perspective view of the extraction tool used to separate interconnected receptacles.

DETAILED DESCRIPTION OF THE INVENTION

Figure 1:
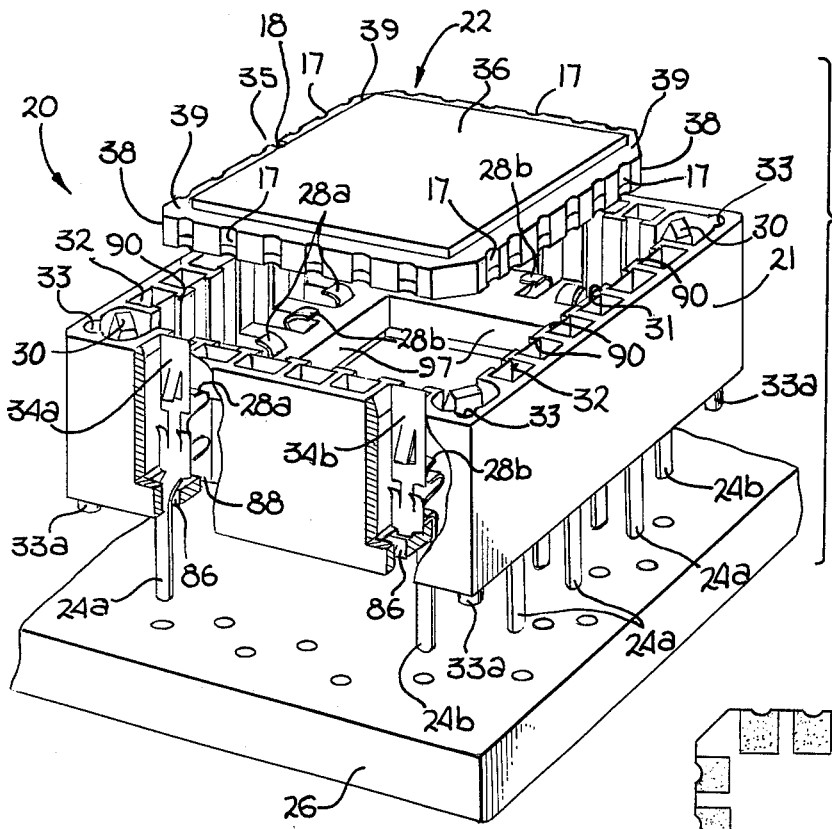
FIG. 1 is an exploded view illustrating the major components of the present invention.

The present invention package, as may be seen in the perspective view of FIG. 1, is comprised of a first receptacle 20 and chip carrier assembly 22. The receptacle 20 has a plurality of spring contact members 34 having downwardly extending leads or pins 24 for insertion in mating holes 19 in a printed circuit board or other circuit member, such as circuit board 26, for electrically connecting thereto by soldering or other conventional connection techniques. The upper portion of leads 24 comprise a plurality of shaped contacts 28 for contacting conductive regions on the chip carrier. The contacts 28 are cantilevered members having a projection with at least one component for engaging a conductive region on the chip carrier assembly 22. The receptacle 20 in this embodiment includes a housing 21 which is a molded plastic member having a square or rectangular configuration. The upper rim of housing 21 is characterized by four resilient members, or fingers 30, and a plurality of members 31 having a T-shaped cross section forming rectangular pockets 32. The contacts 28, contact arms 25 and leads 24 form the spring contact members 34 which are disposed in pockets 32. The rim also has means for aligning a second similar receptacle such as holes 33 which accept and interlock with protuberances 33a (See FIG. 5). Protuberances 33a are preferrably elongated metal pins with optionally one pin being of a different size for keying or aligning (i) the lower receptable 20 to the board 26 and/or (ii) an upper receptacle to the lower receptacle 20 as discussed more fully hereinafter. Other means for aligning and interlocking two receptacles together are within the scope of this invention such as reversal of parts, different forms of protruberances and nonintegral members formed on the second receptacle.

The chip carrier assembly 22 is comprised of a ceramic substrate 35, with a cover 36, typically metal (e.g. gold plated nickel alloy). Scalloped or grooved areas 17 on the sides of the assembly 22 are formed during its manufacture and have a portion which is gold-coated in the preferred embodiment. Keying or indexing slot 18 on one side of the assembly 22 mates with a protuberate disposed on one of the T-shaped members 31. This permits the assembly to be properly disposed in the receptacle housing 21. Slot 18 and the mating protuberance will be further discussed with reference to FIGS. 2 and 4. The chip carrier of this embodiment is further characterized by flattened angular areas 38 adjacent each corner thereof, and capable of being held in position in the receptacle 20 by fingers 30.

Figure 2:
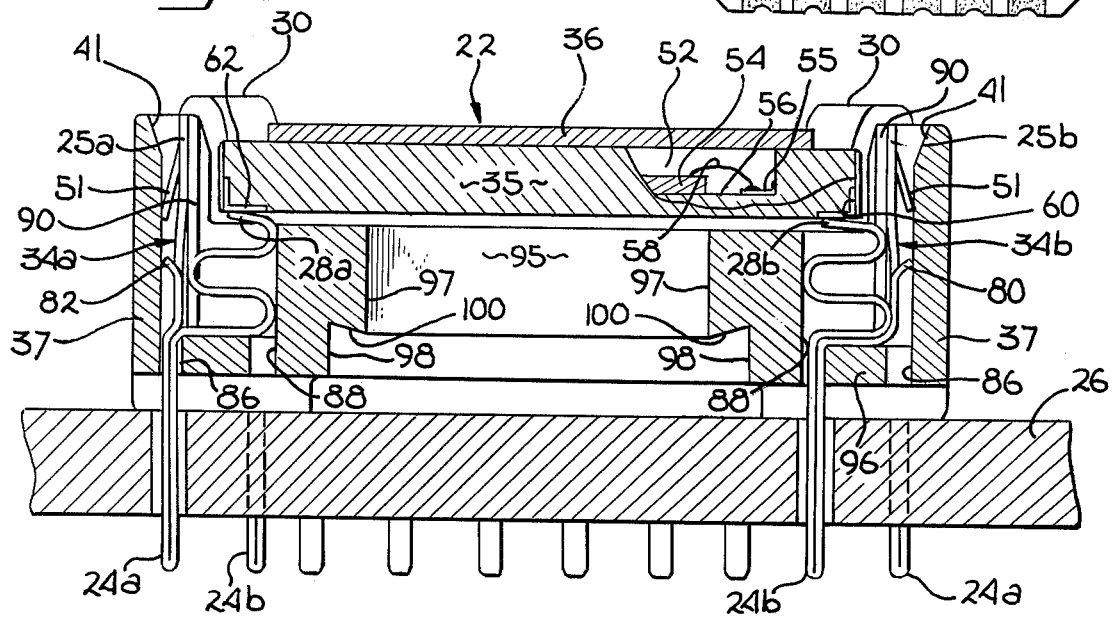
FIG. 2 is a cross sectional view of the receptacle shown in FIG. 1.

The spring contact members 34 including the terminals or leads 24, the upright arm members 25, and contacts 28 may be seen most clearly in FIGS. 2 and 5. These members are stamped from a strip of sheet metal and bent to the forms shown in FIG. 5. It is possible to form members 34 from one or more parts. (It should be noted that spring contact members, are of two different forms hereinafter referred to as 34a and 34b as shown in FIG. 5.) Spring contact members 34a and 34b are inserted into the pockets or cavities 32 in a receptacle 20 in a predetermined pattern with the terminal 24a and 24b extending through a cooperatively disposed opening at the base 96 of receptacle 20 for mounting to a printed circuit board 26 in a conventional manner. Arms 25a and 25b extend upward and are disposed toward the center of the receptacle 20 against tracks 90.

Referring to FIGS. 2 and 5, integral with terminals 24a and 24b are first horizontal, plate-like portion 44a and 44b lying against the base 96 of the pocket 32. The first plate-like portion 44a of spring contact member 34a extends at an angle from lead 24 and arm 25a and terminates with an approximate 180 degree bend to form a second horizontal plate-like portion 45a. The first and second plate-like members have a generally parallel and spaced apart configuration. The second plate-like portion 45a also forms a 180 degree bend at the end thereof to form a third plate-like portion 47a also in a parallel-like spaced apart configuration with respect to members 44a and 45a. The third plate-like member 47a is again bent back at the end thereof to form contact 28a.

Spring contact member 34a also has arm member 25a extending vertically upward. An important feature is that the arm 25a is offset or disposed inwardly a predetermined distance with respect to terminal 24 such that a space remains between arm 25a and the wall 37 of the pocket 32 (See FIG. 2). As hereinafter discussed, this permits the spring contact member to be securely engaged by the lead of a second spring contact member in a second chip carrier receptacle as shown in phantom lines in FIG. 2. Disposed on arm 25a is a spring-like protrusion or flap 51 which helps maintain a electrical contact with the lead of the second receptacle. Metal protuberance sections 80 and 82 are another point of novelty of the contact and are formed when members 34a and 34b are shaped from the original flat piece of metal. These sections tend to facilitate the resilience of the arm and abut against the wall 37 in the receptacle 20 to insure that arms 25a and 25b are forced against the tracks 90. This helps insure and maintain accurate positioning of arms i.e. the distance between the arms 25a and 25b and wall 37 is uniform. Other configurations and means for maintaining the electrical contact are within the scope of this invention.

Spring member 34b, while of substantially the same shape and configuration as member 34a does have a number of differently shaped sections. For example, the first horizontal, plate-like portion 44b is bent at an approximate 180 degree bend with the lead 24b at one end and the arm 25b adjacent the apex of this first bend. Approximately at the junction between the first plate-like portion 44b and the arm 25b, the member 44b is bent back 180° to form second plate-like portion 45b. The arm 25b continues vertically upward. Second plate-like portion 45b also bent a 180° bend at the end thereof to form the third plate-like portion 47b. The third plate-like portion 47b is bent back at the end thereof to form contact 28b. It should be noted that in the preferred embodiment contacts 28a and 28b form substantially angular components to insure proper line contact with the chip carrier 22.

Figure 3:
FIG. 3 is a bottom view of the chip carrier substrate.

Referring again to FIGS. 1 and 4, the top of the receptacle 20 may be seen. The receptacle 20 contains a pattern of pockets 32 within which the spring contact members 34 may be inserted to form an upward projecting pattern of contacts 28 cooperatively disposed with respect to the electrical contact regions 62 on the bottom surface of the chip carrier (FIG. 3). The pockets 32 are arranged along each wall of the receptacle on the inside surface thereof in a generally rectangular configuration. Each pocket is tapered near the top thereof to aid in the insertion of spring member 34a and 34b. There is also provided a plurality of openings or slots 86 and 88 adjacent to the bottom of the pockets 32 which help position the arm 25.

The upward extending spring contacts 28a and 28b generally not restrained in pocket 32 so as to be yieldably encouraged downward by the lower surface of the chip carrier body upon insertion of the chip carrier assembly into the receptacle. In this regard, in the preferred embodiment, the form of the spring members 34a and 34b is such that there is a clearance between the contact members 28a and 28b at region 50. This enables the extent of forcible sliding of the contacts 28a and 28b on the conductive undersurface of the chip carrier to be controlled and held to a minimum consistent with the requirement of sufficient mechanical abrasion to break any slight surface oxide which might develop on either of the mating parts. Moreover, because the contacts 28a and 28b make a point contact of improved reliability with the substrate 35, a gas tight joint is formed, which, because of the force of these members, can create a cold weld between them. In the preferred embodiment, contacts 28a and 28b flex downward about 0.010 inches. This point contact is a substantial advantage over the prior art, as the prior art devices make contact with the chip carrier not from the bottom thereof but from the side thereof, resulting in a snow plowing action across the entire length of the side by the spring contact making contact therewith. In addition, action of spring contact members 28a and 28b is substantially independent of the arms 25 and flap 51, and vice versa.

It can be seen in FIGS. 2 and 4 that the contact spring members 34a and 34b are disposed in various pockets 32. The spring members are easily inserted into the pockets because of taped or inclined areas 41. At the bottom of each pocket 32, two slots 86 and 88 are provided for insertion of the leads 24. The first plate-like portion 44a and 44b rest on the area between the slots 86 and 88. However, depending on which contact spring member 34a or 34b is inserted, the arm member 25 occupies a somewhat different position. For example, arm 34a is disposed against channels or tracks 90 because it is bent inward with respect to the receptacle 20. Spring contact member 34b is also shaped to be disposed inward toward the center of the receptacle and against tracks 90. The inward positioning is uniformly maintained because metal protuberances 80 and 82 are disposed against back wall 37 of the receptacle. Flap 51 may also abut against the back wall 37 of the receptacle. Flap 51 helps insure proper electrical contact between leads 24 of a second receptacle when disposed into pocket 32 between the back wall 37 of the receptacle 20 and the arm members 25a and 25b as hereinafter discussed. In summary, in comparing spring contact member 34a and 34b the following differences should be noted. First, the terminals are offset when arms 25 are aligned in a coplanar vertical plane. Second, the sinusoid type member formed by the bends and parallel-like plates are out of phase with the ends thereof terminating in a different orientation, i.e., on member 34a contact 28a is disposed toward arm 25a, and on member 34b contact 28b is disposed away fron arm 25b.

Now referring to FIGS. 2 and 3, the details of the chip carrier assembly may be understood. Substrate 35 has an cavity 52 in the top surface thereof for receiving the electronic component, typically an integrated circuit chip 54. A plurality of metal contacts or metallized regions 55, usually gold, are provided on surface 56, typically below the level of the contact pads on the chip 54 so that conventional wire bonding means may be used to provide lead wires 58 between the chip and metallized contact regions on surface 56. The substrate 35 has a generally square or rectangular shape with scalloped areas 17 along the length of the upwardly extending sides thereof. The scallops have a portion of the side regions which is coated with gold or other contact metal as a result of the process used to form side contact regions 62. Basically the process includes the steps of providing a substrate with a plurality of holes disposed therethrough. The substrate is coated with a metal which enters each hole. The substrate is then divided along a pattern formed by the holes thus leaving scalloped sides on each substrate.

One side of substrate 35 has a keying slot 18 which mates with a generally cylindrical member 14 disposed on one of the T-shaped members 31. This permits only one configuration of the substrate 35 on the receptacle and thus prevents improper placement. These metallized regions are connected through the wall of substrate 35 to make contact with metallized side regions 60 and metallized generally rectangular or square contact regions 62 on the base or bottom surface of the substrate 35. Also typically at least one of the contact regions 62 is in electrical contact with the metallized region to which a metal cover may be fastened so as to provide electrostatic shielding for the electronic device by the cover. Cover 36 may be attached by a solder seal ring or by a nonmetallic adhesive such as a thermoplastics or thermosets. As a result of this structure, there is a pattern of contact pads on the bottom surface of the chip carrier connected in a predetermined manner to the device packaged within the chip carrier assembly, and typically to the cover and base of the pocket in which the chip 54 is mounted so as to provide shielding for the device and a substrate contact. In the preferred embodiment contacts 62 are separated by about 0.013 to 0.017 inches. The distance between the center of each scallop on a side is 0.070 to 0.040 inches.

Because of the unique shape of spring contact members 34, a second or upper receptacle of substantially the same design can be interconnected in a piggy-back arrangement, i.e. one receptacle on top of the other receptacle. This is shown in FIG. 4. In the presently preferred embodiment, all the spring contact members disposed in upper receptacle 102 are of the 34a variety. Upon coupling upper receptacle 102 with lower receptacle 20, the leads 24a of the spring members 34a in the upper receptacle electrically couple with the various spring members in the lower receptacle. Note that some of the spring contact member 34a in the upper receptacle mate with spring contact members 34b while others mate with spring contact members 34a. Thus, the upper receptacle 102 is electrically coupled to members 34a and 34b, which in turn are disposed through outer slot 86 and inner slot 88 respectively. By alternating inner and outer slots, 88 and 86, on the lower receptacle, with compatable openings in the circuit board, at least twice the packing density normally achieved can be achieved in the same unit of the circuit board. Separation of the upper and lower circuit can be achieved by selective placement of the contact regions 62 in the upper and lower chip carriers 34.

To mechanically position the upper receptacle 102 to the lower receptacle 20, generally cylindrical protrusions 33a of the upper receptacle are disposed in openings 33 in the lower receptacle such that the two receptacles are mechanically coupled together. One protuberance 33a is shown in FIG. 4 as having a somewhat different shape than the remaining protuberances. This is for keying on indexing the receptacles such that only one interconnection can be achieved. Other means of aligning and interconnecting the receptacles together are within the scope of this invention. After the protrusions 33a and openings 33 are lined up, pressure is applied to the upper and/or lower receptacle so as to cause the terminals of the upper receptacle 102 to be disposed between the wall 37 of the lower receptacle 20 and the flaps 51 of the spring contact members 34a and 34b. Flaps 51 thus perform two necessary and important functions. First, they insure that a space for insertion of the upper terminals is present, and second, they help insure an electrical path between the upper and lower receptacle.

As previously mentioned, the fingers 30 snap over the corner regions 38 to retain the chip carrier assembly by engagement of surfaces 39, as may be seen in FIG. 1. In the preferred embodiment both upper and lower receptacles have such fingers. Each of the corner fingers, disposed generally at 45 degrees with respect to each side of the upper or lower receptacle, are integrally molded as part of the receptacle body. When the chip carrier is inserted, the corner fingers are subject to a bending movement. Thus, while the bending moment is greatest near the bottom of the fingers, when the carrier is forced between the fingers, the bending is relatively uniformly distributed, maximizing the amount of elastic deflection possible without breakage or failure to elastically return. This is facilitated by the configuration of the fingers. In the preferred embodiment materials and proportions are selected so that the finger, when depressed outward will contact the edge of the receptacle before any deterioration is caused by the deflection. Accordingly, only extreme misuse will cause damage or breakage of the finger as a result of the incorporation of this built in stop.

As may be seen in FIGS. 2 and 4, the finger snaps over the corners 38 of the chip carrier assembly so that the chip carrier will be engaged on the corner surfaces 39 and retain the chip carrier in the desired position. In the preferred embodiment, surfaces 39 are provided so that the height of the finger is only slightly higher than the top surface of the cover 36 of the chip carrier to maintain a low profile in the assembly for maximum possible packaging density. Of course, also the relative proportions of the receptacle pockets and the spring contact members 34 are chosen so that when the chip carrier assembly is pushed into the position all spring contact members make electrical contact with the respective metallized regions 62 on the bases of the chip carrier assembly and a controlled deflection of each contact 28 is achieved to insure the desired contact pressure and positive electrical contact between the terminals 24 and the respective regions in the packaged chip. In the preferred embodiment, lower receptacle 20 is first positioned on the board 26, the chip carrier 22 is coupled thereto, and the upper receptacle is inserted into the lower receptacle.

In order to selectively couple the contacts 34a in the upper receptacle 102 to the board 26, a portion of selected contacts in the upper and/or lower receptacle is removed. Referring again to FIG. 5, contacts 28a and 28b can be cut, for example along the broken line, and removed. Inserting contact 34a in upper receptacle 100 with contact 28a removed would mean that no contact would be made between that member and the substrate disposed in the upper receptacle. Likewise, inserting spring member 34a or 34b which had contact 28a or 28b removed in the lower receptacle would prevent the spring member from contacting the substrate in the lower receptacle. In this manner, the upper and lower receptacles can be electrically coupled together in a predetermined configuration, as well as electrically coupling the upper receptacle to the board 26 in a predetermined manner. For example, if a contact 28a of a desired spring member 34a on the lower receptacle was removed, there would still be an electrical path from this spring member to a spring contact member in the upper receptacle and the substrate disposed therein. However, there would be no contact between the substrate in the upper receptacle and the one in the lower receptacle.

An insertion and removal tool for inserting and removing the assembled chip carrier from the receptacle of the present invention may also be used. Such a tool is described in my copending application Ser. No. 508,464 now U.S. Pat. No. 3,951,495. The tool is characterized by a central section having on one end thereof a projection for aiding in the inserting of an assembled chip carrier into the receptacle, and on the other end a projection to use in removing assembled chip carriers from the receptacle. Thus, on the insertion end there is provided a permanent magnet mounted in a projection. The cover 36 of an assembled chip carrier is typically a magnetic material so that the permanent magnet will hold the assembled chip carrier directly against the end face of the insertion tool. Thus, by merely pressing the tool with chip carrier in position against the receptacle, the chip carrier may be caused to snap on the finger members so as to be retained thereby, since the insertion tool and particularly the flattened corners are such as to allow the fingers to snap into position against surfaces 38 on the chip carrier.

A plastic extraction tool 91 for removing one receptacle from another and from the board 26 is shown in FIG. 6. The tool has two substantially parallel spaced apart flexible arm members 93 coupled together at one end having an enlarged member 94 at each other end thereof. After the carrier 22 is removed, the arms of the tool are flexed inward and inserted into opening 95. (See FIG. 2). Opening 95 is a cutout area of wall 97. Wall 97 is further cut back in areas 98 of form steps 100. The enlarged members 94 move into areas 98 when the arms 93 are released and extend outward, and as the tool is extracted upward from the receptacle, steps 100 are engaged by members 94. Thus upward movement causes the receptacle to likewise be disposed upward. In the preferred embodiment, members 94 are outwardly extending V-shaped angular member have a ledge on the top thereof. The ledge is what engages steps 100.

There has been described herein a chip carrier and receptacle, alone and interlocked with a second receptacle, which provide high density packaging, high reliability in the electrical contact between the chip carrier and receptacle, and which minimizes deterioration of the conductive regions on the chip carrier by minimizing the extent of sliding between the spring contact and the metallized region.

In the prior art dual-in-law package (DIP) the distance between each hole in the circuit board is as a minimum about 0.100 inches. Because of the staggared arrangement of the leads or pins 24 in this invention, the lateral distance between holes 19 is 0.055 inches and the diagonal distance is 0.077 inches. This means that more contacts can be made per unit of board area.

Another advantage of the hereinabove described device is that contact is made below the substrate by contacts 28a and 28b. This permits more contacts to be made in the same area. In a typical DIP having 16 pin contacts the area of the substrate would be about 0.0482 square inches. This is the same area used by the substrate of the present substrate which has 24 pin contacts. In the present invention, a substrate having 16 pins has an area of 0.0322 square inches. Moreover, no lead trimming or bending is necessary to achieve reliable contact between the substrate 35 and the contact spring members. Likewise, no soldering or the like is necessary to secure the contact regions to the spring contact member.

It should be noted that more than two receptacles can be coupled together. For a memory of 1K ram, 10 address leads of pins are needed; for 2K ram — 11 address pins and for 4K — 12 address pins. At least one pin is needed for each chip select, therefor for one chip receptacle 13 pins are needed for a 4K ram. If two receptacles are coupled together using standard addressing techniques, 12 address pins and 9 support pins are needed plus one chip select pin or a total of 22 pins. As each receptacle can accomodate up to 24 pins in the presently preferred embodiment, 2 additional pins are unused. With this configuration, 4 receptacles can be stacked using the 2 additional pins as pin selects. This further increases the number of chips per board area and decreases board costs.

While the preferred embodiment has been described in detail herein, it will be understood by those skilled in the art that various changes in form and detail may be made therein without departing from the spirit and scope of the invention.

I claim:

1. A chip carrier receptacle capable of being coupled to a second chip carrier receptacle, comprising:
   a nonconductive receptacle body having a means for receiving a chip carrier assembly;
   a plurality of spring contact members in said body, each of said contact members having a substantially straight portion thereof forming a terminal extending downward from said body, each of said contact members further having (i) a shaped cantilevered member extending toward the center of said body and disposed in said receptacle body so as to make a point contact with a conductive area on the bottom surface of said chip carrier assembly upon insertion thereof, each said cantilevered member having a projection with at least one component for engaging said conductive area on said chip carrier assembly, said contilevered member making an acute angle with respect to said conductive area such that when said chip carrier assembly is disposed in said receptacle, the end of each said cantilevered member slides across said conductive area and makes a point contact therewith, and (ii) an upright, elongated arm member, said arm member being a substantially vertical member disposed on each said spring contact member such that each lead extending downward from said second receptacle engages an associated arm member;
   means on said receptacle body for releasably retaining said chip carrier assembly in said receptacle therein; and
   means on said receptacle body for coupling said receptacle to said second receptacle.

2. The chip carrier of claim 1 wherein said means for releasably retaining said chip carrier assembly comprises spring fingers on said receptacle for snapping over the edge of said chip carrier.

3. The chip carrier receptacle of claim 1 wherein said means for coupling said receptacle to said second receptacle is a shaped opening which aligns with and engages a pin member on said second receptacle.

4. The chip carrier receptacle of claim 1 wherein said spring contact members have outwardly extending protuberances for positioning said members in said receptacle.

5. The chip carrier receptacle of claim 1 wherein the rim of said receptacle is defined at least in part by T-shaped members forming generally rectangular pockets, said spring contact members being disposed in said pockets.

6. A chip carrier receptacle capable of being coupled to a second chip carrier receptacle comprising:
   a molded plastic receptacle body having a central region for receiving a chip carrier assembly, and a plurality of pockets for receiving spring contact members;
   a plurality of spring contact members, each of said spring contact members being pressed into one of said pockets and extending through said body so as to provide a substantially straight elongated package lead, each of said spring contact members having (i) an integral cantilevered member, said cantilevered member having a projection with at least one component for engaging a conductive area on the bottom of said chip carrier assembly, said cantilevered member making an acute angle with respect to said conductive area such that when said chip carrier assembly is disposed in said receptacle, the end of each cantilevered member slides across said conductive area and makes a point contact therewith, and (ii) an upright, elongated arm member, said arm member being a substantially vertical arm member disposed on each said spring contact member so as to be engaged by an associated lead extending downward from said second receptacle, said arm member further having a flap member for engaging an associated lead of said second receptacle;
   means on said receptacle body for snapping over the edge of and retaining a chip carrier assembly; and
   means on said receptacle body for coupling said receptacle to said second receptacle.

7. The chip carrier receptacle of claim 6 wherein each said pocket has at least one opening adjacent the bottom thereof for positioning each said spring contact member therein such that said contact member extends through said opening.

8. A chip carrier receptacle comprised of:
a nonconductive receptacle body having a means for receiving a chip carrier assembly and having a plurality of pockets formed therein;
a plurality of spring contact members, each of said contact members being pressed into one of said pockets and extending through said body so as to provide a substantially straight, elongated package lead, each of said spring contact members further having (i) a shaped integral cantilevered member, each said cantilevered member having a projection with at least one component for engaging said conductive area on said chip carrier assembly, said cantilevered member making an acute angle with respect to said conductive area such that when said chip carrier assembly is disposed in said receptacle, the end of each said cantilevered member slides across said conductive area and makes a point contact therewith, and (ii) an upright, elongated arm member, said arm member being a substantially vertical arm member disposed on each said spring contact member so as to be engaged by an associated lead extending downward from a second receptacle, said arm member further having a flap member for engaging an associated lead of said second receptacle;
a chip carrier assembly having a plurality of conductive areas on its bottom surface, and means for releasably retaining said chip carrier assembly in said receptacle whereby each said spring contact members is in forcible point contact with a respective one of said conductive areas; and
means on said receptacle body for coupling said receptacle to said second receptacle.

9. The chip carrier receptacle of claim 8 wherein each said arm member is disposed toward the center of said receptacle body.

10. The carrier of claim 8 wherein said receptacle body is plastic.

11. Upper and lower chip carrier receptacles interconnected so as to form a discrete, leadless package system comprising:
upper and lower nonconductive bodies, each said body having means for receiving a chip carrier assembly; and
upper and lower spring contact members in each said respective bodies, each of said contact members having a portion thereof forming a lead extending downward from each said body each of said spring contact members further having (i) a shaped cantilevered member disposed in said respective receptacles so as to forcibly slide across a conductive area on the bottom surface of each said respective chip carrier assembly upon insertion thereof, and make a point contact therewith, said cantilevered member making an acute angle with respect to said conductive area such that when said chip carrier assembly is disposed in said receptacle, the end of said cantilevered member slides across said conductive area and makes a point contact therewith, and (ii) an upright arm member, each said arm member disposed in said lower receptacle so as to be engaged by said leads of said upper receptacle; and
upper and lower associated chip carrier assemblies, each assembly having a plurality of conductive areas on its bottom surface, and means for releasably retaining each said chip carrier assembly in said respective receptacles whereby each said spring contact member is in forcible contact with a respective one of said conductive areas.

12. The package system of claim 11 wherein each said upper and lower receptacles includes means for aligning and coupling said receptacles together.

13. The package system of claim 11 wherein each said arm member has an outwardly extending protuberance for positioning each said contact member in said pocket.

14. The package system of claim 13 wherein the rim of said receptacle is defined at least in part by T-shaped members forming generally rectangular pockets, said spring contact members being disposed in said pockets.

15. The package system of claim 14 wherein said protuberances cause said arm member to be disposed inward toward the center of said lower receptacle.

16. The package system of claim 11 wherein said means for releasably retaining a chip carrier assembly comprises spring fingers on said receptacle for snapping over the edge of said chip carrier.

17. The package system of claim 11 wherein each said arm member of said lower spring contact member has a flap member for engaging said leads of said upper receptacle.

18. The package system of claim 11 wherein each said body is made of plastic.

* * * * *